United States Patent
Farkas et al.

(10) Patent No.: US 9,482,715 B2
(45) Date of Patent: Nov. 1, 2016

(54) METHOD FOR DETERMINING AN ELECTRICAL PROPERTY OF CABLE INSULATION

(71) Applicant: ABB Schweiz AG, Baden (CH)

(72) Inventors: Andreas Farkas, Stenungsund (SE); Hossein Ghorbani, Karlskrona (SE); Tomas Ahlberg, Rodeby (SE); Johan Andersson, Hisingbacka (SE); Ulf Nilsson, Odsmal (SE)

(73) Assignee: ABB Schweiz AG, Baden (CH)

( * ) Notice: Subject to any disclaimer, the term of this patent is extended or adjusted under 35 U.S.C. 154(b) by 167 days.

(21) Appl. No.: 14/500,009

(22) Filed: Sep. 29, 2014

(65) Prior Publication Data
US 2015/0015273 A1    Jan. 15, 2015

Related U.S. Application Data

(63) Continuation of application No. PCT/EP2012/055373, filed on Mar. 27, 2012.

(51) Int. Cl.
*G01R 31/12* (2006.01)
*G01R 31/08* (2006.01)

(52) U.S. Cl.
CPC ....... *G01R 31/1227* (2013.01); *G01R 31/1272* (2013.01)

(58) Field of Classification Search
CPC .................. G01R 31/1227; G01R 31/1272
USPC ....................................................... 324/551
See application file for complete search history.

(56) References Cited

U.S. PATENT DOCUMENTS

| | | | |
|---|---|---|---|
| 5,416,419 A | 5/1995 | Witt | |
| 2002/0164480 A1* | 11/2002 | Martinotto | C08K 5/132 428/375 |
| 2011/0114365 A1* | 5/2011 | Torgersen | C08L 23/0869 174/120 SC |

FOREIGN PATENT DOCUMENTS

| | | |
|---|---|---|
| JP | H0219741 A | 1/1990 |
| JP | 2004349038 A | 12/2004 |
| WO | 03046592 A1 | 6/2003 |
| WO | 2011057927 A1 | 5/2011 |
| WO | 2011128147 A1 | 10/2011 |

OTHER PUBLICATIONS

Mugala, Gavita. "High Frequency Characteristics of Water-Tree Degraded XLPE Insulation in Power Cables"; IEEE Transactions on Dielectrics and Electrical Insulation vol. 14, No. 5; Oct. 2007; pp. 1271-1277.

International Search Report & Written Opinion Application No. PCT/EP2012/055373 Completed: Dec. 11, 2012; Mailing Date: Dec. 19, 2012 pp. 12.

* cited by examiner

*Primary Examiner* — Billy Lactaoen
(74) *Attorney, Agent, or Firm* — Whitmyer IP Group LLC

(57) ABSTRACT

A method for determining conductivity of cable insulation of a cable including at least one conductor that determines the central axis of the cable and insulation layer surrounding the conductor longitudinally and radially includes steps of retrieving a cable sample from a cable, which sample includes a length of at least one insulation layer and preparing an insulation sample from the cable sample. The insulation sample is prepared from cable sample by cutting a circular layer having a set thickness at desired radius from the central axis of the cable.

8 Claims, 3 Drawing Sheets

METHOD FOR DETERMINING AN ELECTRICAL PROPERTY OF CABLE INSULATION

FIELD OF THE INVENTION

The present invention relates to a method for determining or measuring an electrical property, especially conductivity, of the insulation of an electric cable, especially a high voltage alternating current cables (HVAC) or high voltage direct current (HVDC) cables.

BACKGROUND OF THE INVENTION

The conductivity, or insulation capability, of the insulation layer of a HVDC or HVAC cable is one of the most important parameters in the quality of cable. High conductivity of the insulation anywhere in the cable creates high risk of thermal runaway and breakdown of the cable. Besides the level of conductivity, the profile of conductivity is also a very important issue. If some parts of the cable have higher conductivity than the other part, the electric field in the parts with lower conductivity will be enhanced and this may cause breakdown. Because of the reasons above, there is a very high interest in gaining information about the level and profile of conductivity of the cable insulation. Conventional routine testing of cables will not reveal possible problems related, for example to essential DC-properties e.g. conductivity of the insulation.

Currently two methods are used for measurement of conductivity. One is to make plaque samples by press from the insulation material before it is molded or pressed on the cable and measure the conductivity of the sample. In this method the uncertainties about the similarity of conductivity in the produced plaque sample and the cable is always an issue since the sample piece can't be related to any definite place of the cross section profile of the produced insulation layer. Further, samples made of raw material do not reflect the effects of the manufacturing process to the insulation layer. Therefore the results obtained by these methods are only indicative. According to another method, the conductivity of a cable piece is measured by measuring the leakage current of the cable under DC voltage; this method gives only the overall conductivity of the cable and not the conductivity profile. As this method requires measuring a long length of a cable, it is very hard and expensive to realize as a routine measurement under production.

WO 201112847 discloses a method for controlling the conductivity of the insulation. In this method pellet samples are taken from raw material and pressed into plaque samples, whereof the measurements can be performed. This method provides indication of the properties of the raw material only and the final quality of the cable insulation can't be assessed. WO 2011057927 a same type of method.

WO 03046592 discloses a method wherein a DC voltage of 15 kV is applied between a metal screen of the cable and a semiconductive layer of a cable sample. The method requires a long sample, according to the publication a sample having length of 20 m is needed.

U.S. Pat. No. 5,416,419 discloses a method for deterioration of the insulation of a power cable.

SUMMARY OF THE INVENTION

The purpose of one aspect of the invention is to provide a method for testing the at least one electrical property of the insulation of a power cable in a simple manner.

One other purpose of embodiments of the invention is to provide a method, wherein only small sample length of cable is needed for testing.

One further purpose of various embodiments of the invention is to provide a method wherein the samples can be taken at various places over the cross section of the insulation layer and conductivity of the samples measured to gain information both on the level and profile of conductivity.

Further purposes of the embodiments of the invention are to provide a method wherein the level of conductivity from different cables can be compared and used. Fresh cables, heat treated cables and aged cables can be measured to compare their conductivity levels and profile. The method can be used as a routine or sample quality control test.

Finally, the invention provides embodiments for assessing properties and quality of cable accessories such as joint materials or adapters to measure their conductivity or permittivity.

According to the present invention, a plaque sample is taken from an insulation layer made on a cable conductor. The plaque sample is taken by retrieving a sample from a cable or cable accessory, which sample includes a length of at least one insulation layer and at least one insulation sample is prepared from the sample (17). Preparing the insulation sample is done by cutting from cable or accessory sample by a method for removing material a circular layer, which has a set thickness and is cut at a location that is positioned at such radius from the central axis of the cable wherefrom the insulation sample is desired to be taken.

According to one embodiment multiple insulation samples are cut from the cable sample at different radiuses. This enables assessing the profile of properties of the insulation layer.

According to one embodiment of the invention, the cable sample is taken from an insulation layer made by normal manufacturing process used for making the cable. The purpose of this embodiment is to provide information of finished product instead of raw materials.

According to one other embodiment of the present invention, the plaque sample is made by taking a tube sample from the insulation layer and by cutting it open to provide a plaque sample. This method provides a possibility to make a sample that has exactly the dimensions that are desired.

According to one further embodiment of the invention, the sample is taken by cutting a sheet layer at a desired radius around the central axis of the cable. This method may provide simple and quick way to make a sample from the insulation layer.

According to one embodiment of the invention the sample is made by cutting with a die. This method provides a way to easily standardize the sample making.

According to one embodiment of the invention, the sample length of the cable is less than 600 mm and preferably on a range of 150 to 400 mm. Thus only a small sample of the cable is needed.

The embodiments of the invention provide essential benefits and possibilities to control and monitor the quality and properties of cable products and like.

The idea behind the invention is to get plaque samples from different parts of the cable and measure the conductivity of the samples to gain information both on the level and profile of conductivity. To be able to use this method several challenges exist. These are considered in this disclosure. The embodiments of the invention cover the overall procedures of sample taking, storage, measurement and analysis of the results.

The various features of the method according to the invention provide a wide range of applications. The main application is to compare the conductivity of the cable insulation in different radiuses, in inner and outer parts of the insulation. The level of conductivity from different cables can be compared and used for quality assessment and product development. Fresh cables, heat treated cables and aged cables can be measured to compare their conductivity levels and profile. The method can be used as a routine or sample quality control test.

Beside the conductivity of the high voltage cables, the same method can be used to determine other electrical properties of the cable insulation such as permittivity and breakdown strength. The method can be applied to both HVAC and HVDC cables and same method can be used to obtain plaques samples from cable accessories such as joint materials or adapters to measure their conductivity or permittivity.

The method gives a possibility to assess the conductivity, permittivity or breakdown strength of the material with high geometrical accuracy. During the measurements, conductivity can be calculated vs. time. Generally, the method gives the electrical properties of the insulation in a specified radius of the cable or accessory. Therefore both level and profile of the conductivity in time and radius can be obtained and compared.

One very important feature of the invention is that it provides a method for obtaining information from the cable insulation from a finished product. As known methods wherein samples of insulation material are examined are performed on raw material before extrusion or casting on the cable and before possible final thermal treating steps, the known methods have not been able to give information on the final properties of the product as manufactured. The invention gives a possibility to monitor the product in a state when it is delivered to users and thus provides information of quality of production process also.

Other objects and features of the invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

FIG. 2b shows a cross section of the sample shown in FIG. 2a.

DETAILED DESCRIPTION OF THE INVENTION

In the following, the invention is described in more detail and referring to exemplifying examples describing various embodiments of the invention.

Definitions of the terms used:

Tube Samples:

Herein the tube samples are thin cylindrical samples that are retrieved from cables and used in the measurement. These cylindrical samples are referred as tube samples.

Plaque Samples:

The tube samples are cut open and flattened to form a sheet to be used in the measurements. This sheet is referred to as plaque samples.

Degassing:

Degassing is a heat treatment step in the production of extruded cables that is used to remove some undesired by-products from the cable insulation.

Conductivity Measurement:

The samples are stressed by DC voltages and the current through the samples is measured to calculate the conductivity of the material.

Polar Substances:

Polar substances refer to all low weight molecules with polar structure inside the polymer matrix. The polar substances are important because they are supposed to be the most important parameter that affects the conductivity of the polymers. Polar substances are introduced into the polymer either through additives, substances which get in touch with the polymer during production, or by the polar by-products formed inside the polymer during extrusion and cross linking.

Diffusion:

Diffusion the movement of low weight molecules inside the material matrix, in this case insulation polymer. This process is rather slow in cable insulation polymers and is dependent on temperature, type of the low weight molecules and structure and composition of the polymer matrix.

Migration:

The diffusion of low weight molecules from one material to another material is called migration. In this case the migration can happen from the polymer into surrounding air or other polymers which are in touch with the insulation polymer.

Set Thickness:

Set thickness is the thickness of the sample taken from the insulation. This thickness is set according to properties of the insulation and on variables that are to be measured.

Figure 1:
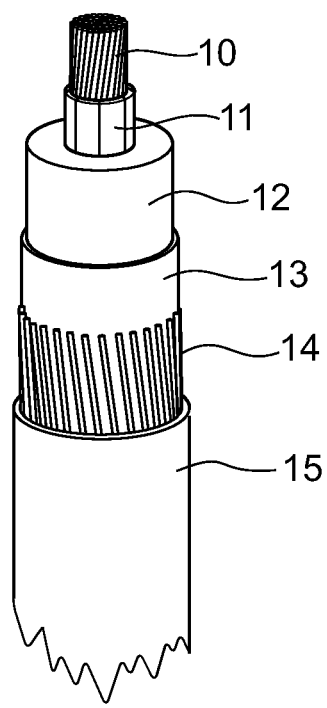
FIG. 1 is a schematic drawing of a typical high voltage cable.

FIG. 1 shows an example of a high voltage cable. The cable comprises a conductor 10 that is usually made of some highly conductive metal like copper or aluminum. The conductor 10 is surrounded radially and longitudinally by plurality of layers, such as first semiconductor shield 11, a PE based insulating layer 12, a second semiconductor shield 13, a metallic screen 14 and outer covering 15. Each of these layers has specific functions in the cable. The invention relates determining properties of the insulating layer. In this example the insulating layer is PE, but the invention is not limited to any specific insulation material. However, the insulation is usually made of PE or other polymer having low conductivity/good electric insulation capacity.

Figure 2A:
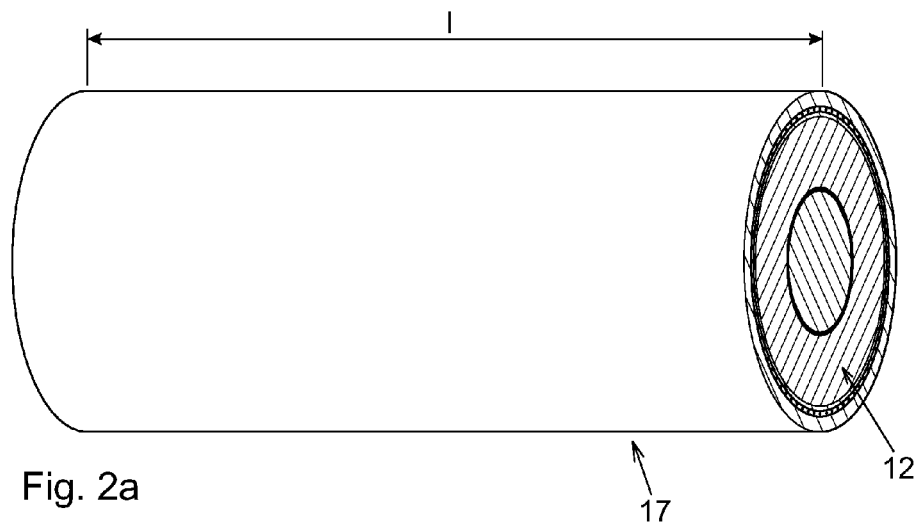
FIG. 2a is a schematic drawing of a sample taken from the cable.
Figure 2B:
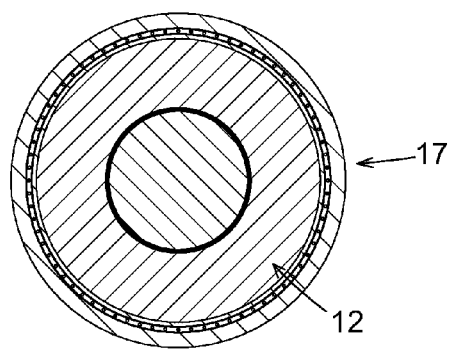
Figure 3:
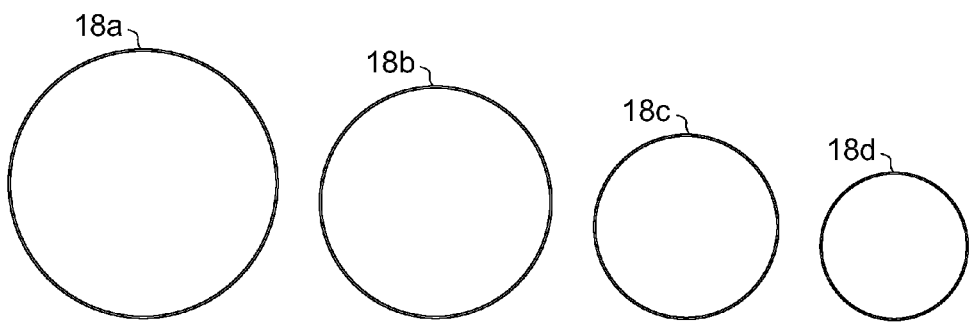
FIG. 3 shows schematic cross sections of samples cut from the sample shown in FIGS. 2a and 2b.
Figure 4:
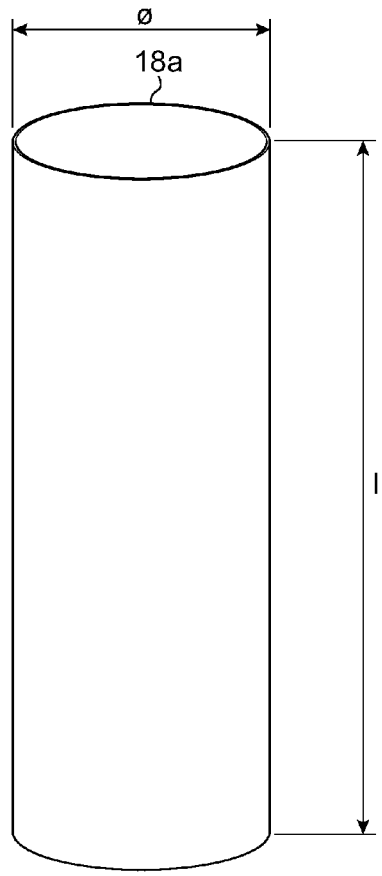
FIG. 4 shows a sample of FIG. 3 in a side view.
Figure 5:
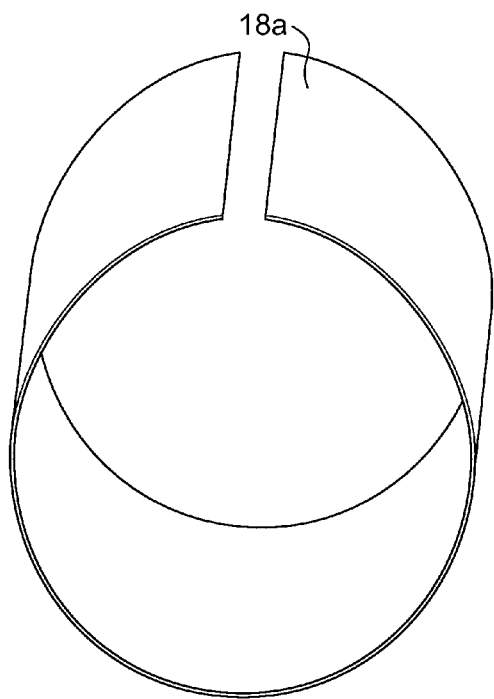
FIG. 5 shows the sample of FIG. 4 when cut open and in cross section.
Figure 6:
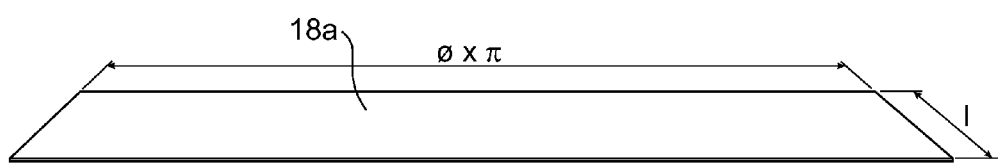
FIG. 6 shows a plaque sample made of sample shown in FIG. 5.

According to the invention small samples of a length l, preferably less than 600 mm, and more preferably on a range of 150 to 400 mm, are extracted from the cable insulation 12. The obtained cable sample 17 is shown in FIGS. 2a and 2b. FIG. 2b is a cross section through the cable shown in FIG. 2a. When the cable sample 17 has been extracted, at least one but preferably a plurality of thin cylindrical samples 18a-18d are taken from the cable sample 17 at different radial positions, as shown in FIG. 3. The thickness of the wall of the insulation samples 18a-18d is preferably about 1 mm, but can be adjusted according to the measurement method, the type of insulation and such variables. One of the samples 18a is shown in FIG. 4. The diameter of the sample 18a is Ø, and the height of the sample is I. The cylindrical samples 18a-18d are cut longitudinally open, as shown in FIG. 5, and subsequently bent or flattened/compressed into thin plaque samples, as shown in FIG. 6. The size of the sample is ØΠx1. These plaque samples are used for electrical or other measurements. One or more electrical properties, such as conductivity, are measured on each of the thin plaque samples to gain information both on the level and profile of the property.

According to the invention, thin, preferably cylindrical samples are retrieved from the cables and used in the measurements. The invention provides method for measuring electrical properties such as conductivity in different parts of the cable insulation. Besides conductivity, other electrical measurements and test such as dielectric spectroscopy, tangent delta measurement, BD test, etc can also be performed on the plague samples. The cable sample retrieved can be a piece of extruded cable cut from an extruded cable in any stage of the production.

In the following some considerations about preparing and handling the plaque samples are presented.

A piece of cable (cable sample) should be preferably cut from a produced cable. The cable sample can be cut from fresh cable, after heat treatment, complete cable or even from cables in service or aged cables.

The cable piece length should be between 30 to 50 cm, or less. The cable piece must be wrapped in aluminum foil or other types of diffusion barriers after cutting to block the degassing of the cable during transportation and storage. The retrieved cable sample, wrapped in aluminum foil, should be cooled down by putting in freezer or by other means to slow down the diffusion processes. The storage should also be done in a cold environment such as freezer.

Production of the Plaque Samples

In order to produce the plaque insulation sample, the cable piece must have the outer layers removed. A thin cylinder from the cable at a desired radius of the insulation should be cut out of the cable sample piece. Different methods can be used for this purpose. The piece may be cut as a whole cylinder or as a sheet in a similar manner as veneer is cut from wood material. Methods that can be contemplated as cutting methods are all machining methods used for removing material from a workpiece, such as cutting with blade, ultrasonic blade, a die, cutting or working with laser beam or any suitable method by which a cylindrical or sheetlike sample can be retrieved from the insulation of the cable sample.

The following text relates to contemplated procedures and steps for treating and handling the samples and measurement procedures. However, the invention is not limited to these procedures only.

The following text relates to contemplated procedures and steps for treating and handling the samples and measurement procedures. However, the invention is not limited to these procedures only.

During sample production, the insulation should be preferably kept cold to avoid the diffusion of the byproducts out of the material. The cooling can be done by cooling down the sample before extracting it from the cable sample piece and by using cooling techniques such as dry ice vapor to keep the sample surface cold. After cutting even a first surface of the sample, it should be wrapped with aluminum foil or other diffusion barriers to avoid the diffusion of the byproducts during cutting possible other surfaces. After production of the cylinder, it can be cut open and wrapped with aluminum foil and cooled down by putting it in a freezer or using dry ice. If the plaque sample is cut as a sheet, it should be treated in similar way as quickly as possible.

Storage and Transportation of the Plaque Samples

The plaque samples are more sensitive to diffusion that a cable sample block. Therefore special attention must be taken during the storage and transportation of the samples. The storage and transportation times must be kept as short as possible by planning the measurements in synchrony with the sample production. During storage and transport, the samples must be kept in void free, vacuumed diffusion barrier foils such as aluminum foil to block the diffusion of the byproducts.

The samples must be kept well below 0° C. during storage and transportation by keeping them in freezer and using mobile freezers and dry ice during transportation.

Measurements on the Samples

Conductivity of the samples as a function of time, temperature and electric field can be measured by standard conductivity measurement methods. Dielectric spectroscopy, tangent delta or other similar methods can be also done to gain information on the conductivity and permittivity of the samples. Break down tests can also be performed although it will be rather costly to do them.

Analysis of the Measurement Results

The electrical properties of the tests performed on the samples can be used to compare the properties in different radius of the cable, different parts of the cable (e.g. start of end of extrusion), cable in different stages (e.g. fresh cable, heat treated cable and completed cable) and also different cables and materials can be compared by comparing their conductivity and permittivity.

Thus, while there have been shown and described and pointed out fundamental novel features of the invention as applied to a preferred embodiment thereof, it will be understood that various omissions and substitutions and changes in the form and details of the method may be made by those skilled in the art without departing from the spirit of the invention. For example, it is expressly intended that all combinations of those elements and/or method steps which perform substantially the same results are within the scope of the invention. Substitutions of the elements from one described embodiment to another are also fully intended and contemplated. It is also to be understood that the drawings are not necessarily drawn to scale but they are merely conceptual in nature. It is the intention, therefore, to be limited only as indicated by the scope of the claims appended hereto.

What is claimed is:

1. A method for determining properties of the insulation of a cable and cable accessories comprising at least one conductor that determines the central axis of the cable or cable accessory and at least one insulation layer surrounding at least one conductor longitudinally and radially, the method comprising:

retrieving a sample from a cable or cable accessory, which sample includes a length of at least one insulation layer, preparing at least one insulation sample from the sample, characterized in that multiple insulation samples are cut from the cable sample at different radiuses, each insulation sample is prepared from cable or accessory sample by cutting by a method for removing material a circular layer that has a set thickness and is cut at a location that is positioned at such radius from the central axis of the cable wherefrom the insulation sample is desired, and a profile of properties is determined on basis of measurements performed on the insulation samples taken at different radiuses.

2. The method according to claim 1, wherein at least one cable sample is retrieved from an insulation layer made by normal manufacturing process used for making the cable.

3. The method according to claim 1, wherein the insulation sample is made by taking a tube sample from the insulation layer and by cutting it open to provide a plaque sample.

4. The method according to claim 1, wherein the insulation sample is taken by cutting a sheet layer at a desired radius around the central axis of the sample retrieved from the cable.

5. The method according to claim 1, wherein the sample length of the cable is set to be less than 600 mm.

6. The method according to claim 1, wherein the method comprises monitoring the quality of the insulation of cables or cable accessories based on said profile of properties.

7. Use of a method according to claim 1 for quality control of the insulation of cables or cable accessories.

8. The method according to claim 5, wherein the sample length of the cable is set to be on a range of 150 to 400 mm.

* * * * *